United States Patent
Sato et al.

(10) Patent No.: US 11,551,914 B2
(45) Date of Patent: *Jan. 10, 2023

(54) PLASMA GENERATING DEVICE, SUBSTRATE PROCESSING APPARATUS, AND METHOD OF MANUFACTURING SEMICONDUCTOR DEVICE

(71) Applicant: KOKUSAI ELECTRIC CORPORATION, Tokyo (JP)

(72) Inventors: Akihiro Sato, Toyama (JP); Tsuyoshi Takeda, Toyama (JP); Yukitomo Hirochi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/200,414

(22) Filed: Mar. 12, 2021

(65) Prior Publication Data

US 2021/0202216 A1 Jul. 1, 2021

Related U.S. Application Data

(63) Continuation of application No. 16/250,673, filed on Jan. 17, 2019, which is a continuation of application No. PCT/JP2017/012414, filed on Mar. 27, 2017.

(30) Foreign Application Priority Data

Jul. 21, 2016 (JP) ................................ 2016-012414

(51) Int. Cl.
  *C23C 16/509* (2006.01)
  *C23C 16/50* (2006.01)
  (Continued)

(52) U.S. Cl.
  CPC .... *H01J 37/32568* (2013.01); *C23C 16/4587* (2013.01); *C23C 16/50* (2013.01);
  (Continued)

(58) Field of Classification Search
  USPC .................................................. 438/791, 792
  See application file for complete search history.

(56) References Cited

U.S. PATENT DOCUMENTS

4,887,005 A * 12/1989 Rough .............. H01J 37/32082
                                                      315/111.21
2004/0025786 A1   2/2004 Kontani et al.
(Continued)

FOREIGN PATENT DOCUMENTS

JP      02-501608 T2    5/1990
JP      07-273037 A    10/1995
(Continued)

OTHER PUBLICATIONS

International Search Report, PCT/JP2017/012414, dated May 16, 2017, 2 pgs.

(Continued)

*Primary Examiner* — Xiaoming Liu
(74) *Attorney, Agent, or Firm* — Volpe Koenig

(57) ABSTRACT

There is provided a plasma generating device that includes a first electrode connected to a high-frequency power supply, and a second electrode to be grounded, a buffer structure configured to form a buffer chamber that accommodates the first and second electrodes wherein the first electrode and the second electrode are alternately arranged such that a number of electrodes of the first electrode and the second electrode are in an odd number of three or more in total, and wherein the second electrode is used in common for two of the first electrode being respectively adjacent to the second electrode used in common, and wherein a gas supply port that supplies gas into a process chamber is installed on a wall surface of the buffer structure.

19 Claims, 11 Drawing Sheets

(51) Int. Cl.
H01J 37/32 (2006.01)
H05H 1/46 (2006.01)
C23C 16/458 (2006.01)
C23C 16/52 (2006.01)
H01L 21/02 (2006.01)

(52) U.S. Cl.
CPC ............ *C23C 16/509* (2013.01); *C23C 16/52* (2013.01); *H01J 37/3244* (2013.01); *H01J 37/32834* (2013.01); *H01L 21/0217* (2013.01); *H01L 21/02274* (2013.01); *H05H 1/46* (2013.01); *H01J 2237/327* (2013.01); *H01J 2237/3323* (2013.01); *H01L 21/0228* (2013.01); *H01L 21/02211* (2013.01)

(56) References Cited

U.S. PATENT DOCUMENTS

| | | | | |
|---|---|---|---|---|
| 2012/0100722 | A1* | 4/2012 | Asai | C23C 16/4408 438/758 |
| 2013/0171838 | A1 | 7/2013 | Okuda | |

FOREIGN PATENT DOCUMENTS

| | | | |
|---|---|---|---|
| JP | 2003-086581 | A | 3/2003 |
| JP | 2004-124234 | A | 4/2004 |
| JP | 2005-167021 | A | 6/2005 |
| JP | 2006-190770 | A | 7/2006 |
| JP | 2007-115883 | A | 5/2007 |
| JP | 2010-027702 | A | 2/2010 |
| JP | 2012-094652 | A | 5/2012 |
| JP | 2012-114340 | A | 6/2012 |
| JP | 2014-049541 | A | 3/2014 |
| JP | 2014-056961 | A | 3/2014 |
| JP | 2015-092637 | A | 5/2015 |

OTHER PUBLICATIONS

Japanese Office Action dated Nov. 17, 2020 for Japanese Patent Application No. 2019-232666.
U.S. Office Action dated Mar. 9, 2021 for U.S. Appl. No. 16/250,673.
U.S. Office Action dated Jun. 4, 2021 for U.S. Appl. No. 17/200,372.
Non-Final Office Action dated Sep. 24, 2021 for U.S. Appl. No. 16/250,673.
Final Office Action dated Sep. 24, 2021 for U.S. Appl. No. 17/200,372.
Chinese Office Action dated Oct. 13, 2022 for Chinese Patent Application No. 201780031471.0.

* cited by examiner

PLASMA GENERATING DEVICE, SUBSTRATE PROCESSING APPARATUS, AND METHOD OF MANUFACTURING SEMICONDUCTOR DEVICE

CROSS-REFERENCE TO RELATED APPLICATION

This application is a Continuation Application of U.S. application Ser. No. 16/250,673 filed on Jan. 17, 2019 which is a Bypass Continuation Application of PCT International Application No. PCT/JP2017/012414, filed Mar. 27, 2017, the disclosure of which is incorporated herein in its entirety by reference.

TECHNICAL FIELD

The present disclosure relates to a plasma generating device, a substrate processing apparatus, and a method of manufacturing a semiconductor device.

BACKGROUND

As one of the semiconductor device manufacturing processes, there may be performed substrate processing in which a substrate is loaded into a process chamber of a substrate processing apparatus, a precursor gas and a reaction gas supplied into the process chamber are activated using plasma, and various films such as an insulating film, a semiconductor film, a conductor film and the like are formed on the substrate or removed from the substrate. Plasma is used to promote a reaction of a deposited thin film, to remove impurities from a thin film, or to assist a chemical reaction of a film-forming precursor.

However, along with a progressive miniaturization in the manufacture of a semiconductor device, it is required to perform substrate processing at a lower temperature. Therefore, in order to uniformly process a predetermined film to be processed, a solution such as increasing high-frequency power serving as a plasma source or the like has been considered. However, if the high-frequency power is increased, it may be difficult to uniformly process a predetermined film.

The present disclosure provides some embodiments of a technique capable of uniformly processing a substrate.

SUMMARY

According to one embodiment of the present disclosure, there is provided a technique that includes: at least one first electrode connected to a high-frequency power supply; and at least one second electrode to be grounded, wherein the first electrode and the second electrode are alternately arranged such that a number of electrodes of the first electrode and the second electrode are in an odd number of three or more in total, and the second electrode is used in common for two of the first electrode being respectively adjacent to the second electrode used in common.

DETAILED DESCRIPTION

Embodiment of the Present Disclosure

Hereinafter, an embodiment of the present disclosure will be described with reference to FIGS. 1 to 6.

(1) Configuration of Substrate Processing Apparatus (Heating Device)

Figure 1:
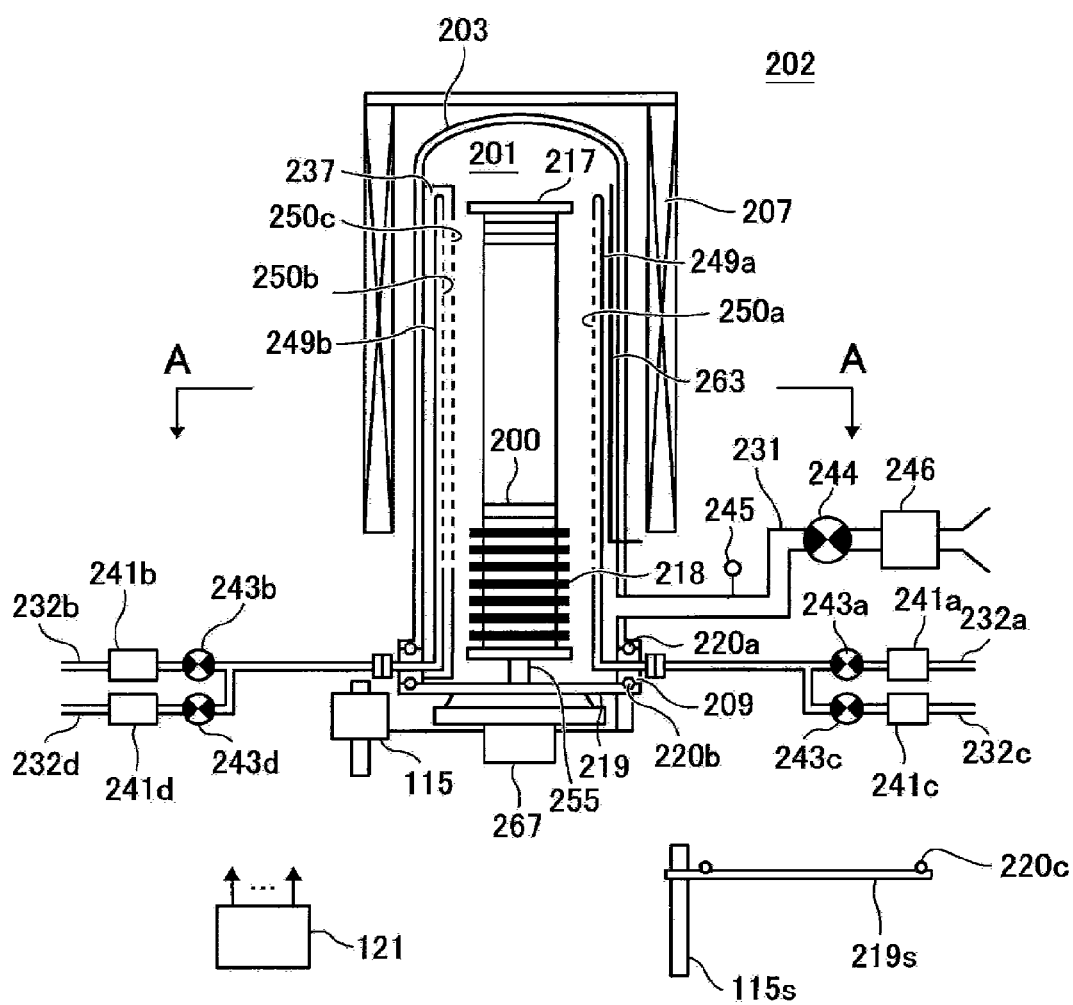
FIG. 1 is a schematic configuration diagram of a vertical process furnace of a substrate processing apparatus suitably used in an embodiment of the present disclosure, in which the process furnace is shown in a vertical sectional view.

As shown in FIG. 1, a process furnace 202 is a so-called vertical type furnace capable of accommodating substrates in multiple stages in a vertical direction and includes a heater 207 as a heating device (heating mechanism). The heater 207 has a cylindrical shape and is vertically installed by being supported by a heater base (not shown) as a holding plate. The heater 207 also functions as an activation mechanism (excitation part) that thermally activates (excites) a gas as will be described later.

(Process Chamber)

Inside the heater 207, a reaction tube 203 is arranged concentrically with the heater 207. The reaction tube 203 is made of a heat-resistant material such as, for example, quartz ($SiO_2$), silicon carbide (SiC), silicon nitride (SiN) or the like and is formed in a cylindrical shape with its upper end closed and its lower end opened. Under the reaction tube 203, a manifold (inlet flange) 209 is disposed concentrically with the reaction tube 203. The manifold 209 is made of a metal such as, for example, stainless steel (SUS) or the like and is formed in a cylindrical shape with its upper and lower ends opened. The upper end portion of the manifold 209 is engaged with the lower end portion of the reaction tube 203 and is configured to support the reaction tube 203. An O ring 220a as a seal member is installed between the manifold 209 and the reaction tube 203. As the manifold 209 is supported by the heater base, the reaction tube 203 is vertically installed. A process container (reaction container) is mainly formed of the reaction tube 203 and the manifold 209. A process chamber 201 is formed in the hollow portion which is the inside of the process container. The process chamber 201 is configured to be able to accommodate a plurality of wafers 200 as substrates. The process container is not limited to the above configuration. Only the reaction tube 203 may be referred to as a process container in some cases.

In the process chamber 201, nozzles 249a and 249b are provided so as to penetrate a side wall of the manifold 209. Gas supply pipes 232a and 232b are connected to the nozzles 249a and 249b, respectively. As described above, the reaction tube 203 is provided with two nozzles 249a and 249b and two gas supply pipes 232a and 232b so that plural kinds of gases can be supplied into the process chamber 201.

Mass flow controllers (MFC) 241a and 241b as flow rate controllers (flow rate control parts) and valves 243a and 243b as on-off valves are installed in the gas supply pipes 232a and 232b sequentially from the upstream side of a gas flow. Gas supply pipes 232c and 232d for supplying an inert gas are connected to the gas supply pipes 232a and 232b, respectively, on the downstream side of the valves 243a and 243b. MFCs 241c and 241d and valves 243c and 243d are respectively installed in the gas supply pipes 232c and 232d sequentially from the upstream side of a gas flow.

Figure 2:
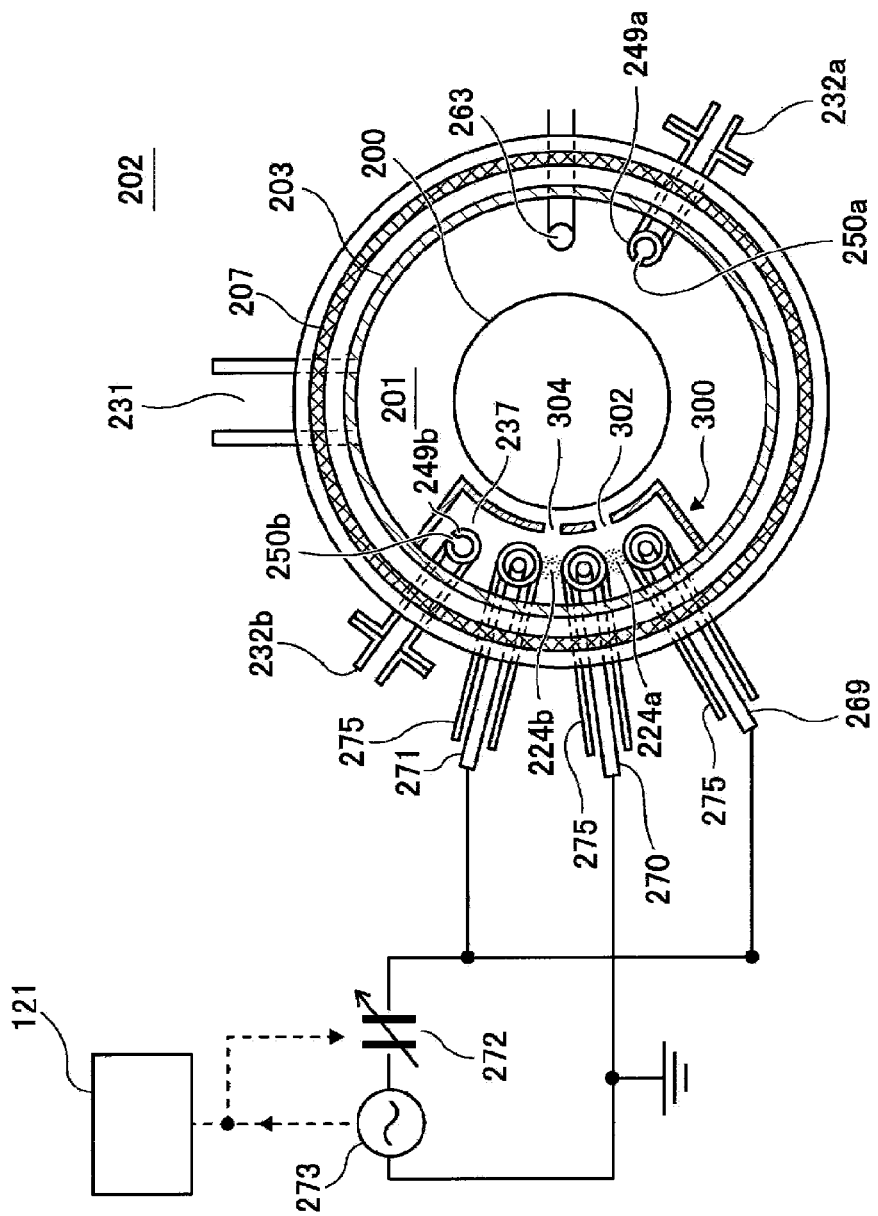
FIG. 2 is a schematic configuration diagram of a vertical process furnace of a substrate processing apparatus suitably used in an embodiment of the present disclosure, in which the process furnace is shown in a sectional view taken along line A-A in FIG. 1.

As shown in FIG. 2, the nozzle 249a is installed in the space between an inner wall of the reaction tube 203 and wafers 200 so as to extend upward in a stacking direction of wafers 200 from a lower portion of the inner wall of the reaction tube 203 to an upper portion thereof. In other words, the nozzle 249a is installed along a wafer arrangement region in a region horizontally surrounding the wafer arrangement region on the lateral side of the wafer arrangement region (mounting region) where the wafers 200 are arranged (mounted). That is, the nozzle 249a is installed in a direction perpendicular to the surfaces (flat surfaces) of the wafers 200 on the lateral side of the end portions (peripheral edge portions) of the respective wafers 200 loaded into the process chamber 201. Gas supply holes 250a for supplying a gas are formed on the side surface of the nozzle 249a. The gas supply holes 250a are opened so as to face the center of the reaction tube 203 and are capable of supplying a gas toward the wafers 200. The gas supply holes 250a are formed from the lower portion of the reaction tube 203 to the upper portion thereof. The respective gas supply holes 250a have the same opening area and are formed at the same opening pitch.

Figure 3A:
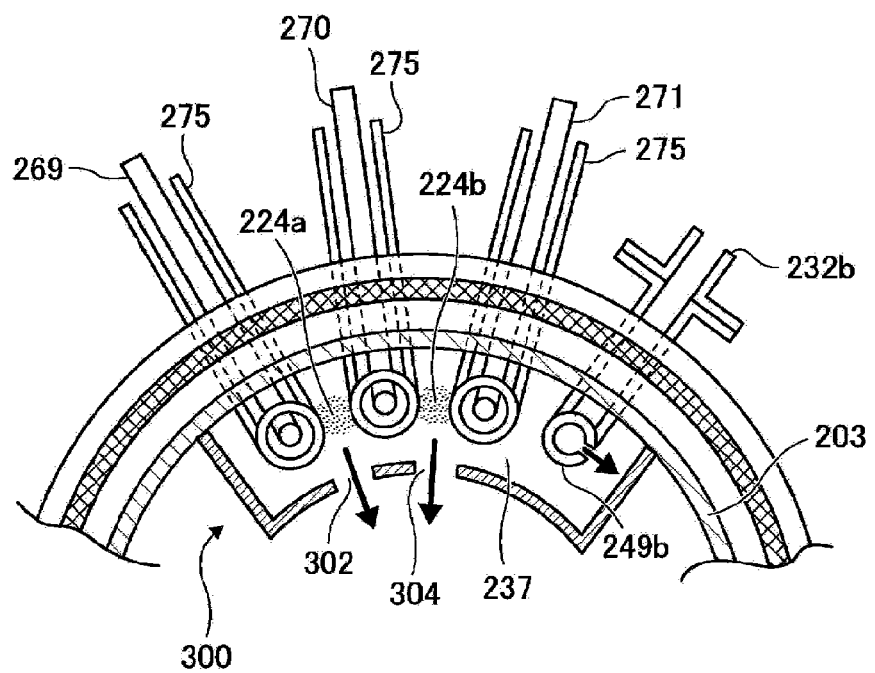
FIG. 3A is an enlarged horizontal sectional view for explaining a buffer structure of a substrate processing apparatus suitably used in an embodiment of the present disclosure.
Figure 3B:
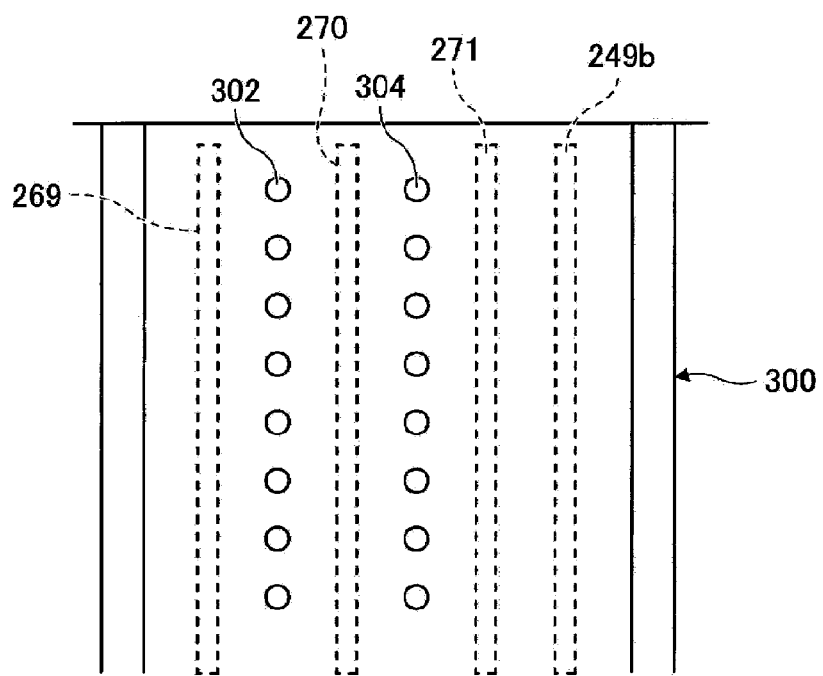
FIG. 3B is a schematic view for explaining a buffer structure of a substrate processing apparatus suitably used in an embodiment of the present disclosure.

A nozzle 249b is connected to a tip of the gas supply pipe 232b. The nozzle 249b is installed in a buffer chamber 237 which is a gas dispersion space. As shown in FIG. 2, the buffer chamber 237 is installed along the stacking direction of the wafers 200 in an annular space between the inner wall of the reaction tube 203 and the wafers 200 in a plan view and in a region extending from a lower portion of the inner wall of the reaction tube 203 to the upper portion thereof. In other words, the buffer chamber 237 is formed by a buffer structure 300 so as to extend along the wafer arrangement region in a region horizontally surrounding the wafer arrangement region on the lateral side of the wafer arrangement region. The buffer structure 300 is made of insulating material such as quartz or the like. Gas supply ports 302 and 304 for supplying a gas are formed on the arc-shaped wall surface of the buffer structure 300. As shown in FIGS. 2 and 3, the gas supply ports 302 and 304 are disposed at positions facing plasma generation regions 224a and 224b between rod-shaped electrodes 269 and 270 and between the rod-shaped electrodes 270 and 271 as described below and are opened so as to face the center of the reaction tube 203, so that a gas can be supplied toward the wafers 200. A plurality of the gas supply ports 302 and 304 are formed from the lower portion of the reaction tube 203 to the upper portion thereof. The respective gas supply ports 302 and 304 have the same opening area and are formed at the same opening pitch.

The nozzle 249b is installed so as to extend upward in the stacking direction of the wafers 200 from the lower portion of the inner wall of the reaction tube 203 to the upper portion thereof. In other words, the nozzle 249b is installed inside the buffer structure 300, i.e., in a region horizontally surrounding the wafer arrangement region on the lateral side of the wafer arrangement region where the wafers 200 are arranged, so as to extend along the wafer arrangement region. That is, the nozzle 249b is installed in the direction perpendicular to the surfaces of the wafers 200 on the lateral side of the end portions of the wafers 200 loaded into the process chamber 201. Gas supply holes 250b for supplying a gas are formed on the side surface of the nozzle 249b. The gas supply holes 250b are opened so as to face the wall surface formed in a radial direction with respect to the arc-shaped wall surface of the buffer structure 300. The gas supply holes 250b can supply a gas toward the wall surface. As a result, the reaction gas is dispersed in the buffer chamber 237 and is not directly blown onto the rod-shaped electrodes 269 to 271, thereby suppressing generation of particles. As with the gas supply holes 250a, a plurality of the gas supply holes 250b are formed from the lower portion of the reaction tube 203 to the upper portion thereof.

As described above, in the present embodiment, the gas is fed via the nozzles 249a and 249b and the buffer chamber 237 arranged in a vertically-elongated space having an annular plan-view shape, i.e., a cylindrical space defined by the inner wall of the side wall of the reaction tube 203 and end portions of a plurality of the wafers 200 arranged in the reaction tube 203. The gas is initially injected into the reaction tube 203 in the vicinity of the wafers 200 from the nozzles 249a and 249b and the gas supply holes 250a and 250b and the gas supply ports 302 and 304 which are respectively opened in the buffer chamber 237. The main flow of the gas in the reaction tube 203 is moved in a direction parallel to the surfaces of the wafers 200, i.e., in the horizontal direction. With such a configuration, it is possible to uniformly supply the gas to the respective wafers 200, and it is possible to improve uniformity of film thicknesses of the films formed on the respective wafers 200. The gas flowing on the surfaces of the wafers 200, i.e., the residual gas remaining after the reaction flows toward the exhaust port, i.e., toward an exhaust pipe 231 to be described later. However, the flow direction of the residual gas is appropriately specified depending on the position of the exhaust port and is not limited to the vertical direction.

From the gas supply pipe 232a, a precursor containing a predetermined element, for example, a silane precursor gas containing silicon (Si) as a predetermined element is supplied into the process chamber 201 via the MFC 241a, the valve 243a and the nozzle 249a.

The precursor gas is a precursor in a gaseous state, for example, a gas obtained by vaporizing a precursor kept in a liquid state under a room temperature and an atmospheric pressure, or a precursor kept in a gaseous state under the room temperature and the atmospheric pressure. In the subject specification, when the term "precursor" is used, it may mean a "liquid precursor in a liquid state", a "precursor gas in a gaseous state", or both.

As the silane precursor gas, it may be possible to use, for example, a precursor gas containing Si and a halogen element, i.e., a halosilane precursor gas. The halosilane precursor is a silane precursor having a halogen group. The halogen element contains at least one element selected from a group consisting of chlorine (Cl), fluorine (F), bromine (Br) and iodine (I). That is, the halosilane precursor contains at least one halogen group selected from a group consisting of a chloro group, a fluoro group, a bromo group and an iodo group. The halosilane precursor may be said to be a kind of halide.

As the halosilane precursor gas, it may be possible to use, for example, a precursor gas containing Si and Cl, i.e., a chlorosilane precursor gas. As the chlorosilane precursor gas, it may be possible to use, for example, a dichlorosilane ($SiH_2Cl_2$, abbreviation: DCS) gas.

From the gas supply pipe 232b, a reactant containing an element different from the above-mentioned predetermined element, for example, a nitrogen (N)-containing gas as a reaction gas is supplied into the process chamber 201 via the MFC 241b, the valve 243b and the nozzle 249b. As the N-containing gas, it may be possible to use, for example, a hydrogen-nitride-based gas. The hydrogen-nitride-based gas may also be a material composed of only two elements, N and H, and acts as a nitriding gas, i.e., an N source. As the hydrogen-nitride-based gas, it may be possible to use, for example, an ammonia ($NH_3$) gas.

From the gas supply pipes 232c and 232d, an inert gas, for example, a nitrogen ($N_2$) gas is supplied into the process chamber 201 via the MFCs 241c and 241d, the valves 243c and 243d, the gas supply pipes 232a and 232b, and the nozzles 249a and 249b.

A precursor supply system as a first gas supply system is mainly constituted by the gas supply pipe 232a, the MFC 241a and the valve 243a. A reactant supply system as a second gas supply system is mainly constituted by the gas supply pipe 232b, the MFC 241b and the valve 243b. An inert gas supply system is mainly constituted by the gas supply pipes 232c and 232d, the MFCs 241c and 241d, and the valves 243c and 243d. The precursor supply system, the reactant supply system and the inert gas supply system are collectively and simply referred to as a gas supply system (gas supply part).

(Plasma Generation Part)

As shown in FIGS. 2 and 3, three rod-shaped electrodes 269, 270 and 271 made of a conductive material and having an elongated structure are arranged in the buffer chamber 237 and are arranged to extend from the lower portion of the reaction tube 203 to the upper portion thereof along the stacking direction of the wafers 200. Each of the rod-shaped electrodes 269, 270 and 271 is installed in parallel to the nozzle 249b. Each of the rod-shaped electrodes 269, 270 and 271 is protected by being covered with an electrode protection tubetube 275 from the upper portion to the lower portion thereof. The rod-shaped electrodes 269 and 271 disposed at both ends among the rod-shaped electrodes 269, 270 and 271 are connected to a high-frequency power supply 273 via a matcher 272, and the rod-shaped electrode 270 is grounded by being connected to a ground which is a reference potential. That is, the rod-shaped electrodes, which are connected to the high-frequency power supply 273, and the rod-shaped electrode to be grounded are alternately disposed. The rod-shaped electrode 270 disposed between the rod-shaped electrodes 269 and 271 connected to the high-frequency power supply 273 is a grounded rod-shaped electrode and is used in common with respect to the electrodes 269 and 271. In other words, the grounded rod-shaped electrode 270 is disposed so as to be sandwiched between the rod-shaped electrodes 269 and 271 connected to the adjacent high-frequency power supply 273. The rod-shaped electrode 269 and the rod-shaped electrode 270, and the rod-shaped electrode 271 and the rod-shaped electrode 270, are respectively configured to form a pair, thereby generating plasma. That is, the grounded rod-shaped electrode 270 is used in common for the two rod-shaped electrodes 269 and 271 disposed adjacent to the rod-shaped electrode 270 and connected to the high-frequency power supply 273. By applying high-frequency (RF) power to the rod electrodes 269 and 271 from the high-frequency power supply 273, plasma is generated in the plasma generation region 224a between the rod-shaped electrodes 269 and 270 and in the plasma generation region 224b between the rod-shaped electrodes 270 and 271. A plasma generating part (plasma generating device) as a plasma source is mainly constituted by the rod-shaped electrodes 269, 270 and 271 and the electrode protection tube 275. The matcher 272 and the high-frequency power supply 273 may be included in the plasma source. As will be described later, the plasma source functions as a plasma excitation part (activation mechanism) for plasma-exciting a gas, i.e., for exciting (activating) a gas into a plasma state.

The electrode protection tube 275 has a structure capable of being inserted into the buffer chamber 237 in a state in which each of the rod electrodes 269, 270 and 271 is isolated from the atmosphere in the buffer chamber 237. If an $O_2$ concentration in the electrode protection tube 275 is about the same as an $O_2$ concentration in the external air (atmosphere), the rod-shaped electrodes 269, 270 and 271 respectively inserted into the electrode protection tube 275 may be oxidized by the heat generated from the heater 207. Therefore, an inert gas such as an $N_2$ gas or the like is filled in the electrode protection tube 275, or the inside of the electrode protection tube 275 is purged with an inert gas such as an $N_2$ gas or the like by using an inert gas purge mechanism. This makes it possible to reduce the $O_2$ concentration in the electrode protection tube 275 and to prevent oxidation of the rod-shaped electrodes 269, 270 and 271.

(Exhaust Part)

An exhaust pipe 231 for exhausting the atmosphere in the process chamber 201 is installed in the reaction tube 203. A vacuum pump 246 as a vacuum evacuation device is connected to the exhaust pipe 231 via a pressure sensor 245 as a pressure detector (pressure detection part) for detecting the pressure in the process chamber 201 and an APC (Auto Pressure Controller) valve 244 as an exhaust valve (pressure regulation part). The APC valve 244 is a valve configured so that the vacuum evacuation of the interior of the process chamber 201 and the stop of the vacuum evacuation can be performed by opening and closing the valve in a state in which the vacuum pump 246 is operated, and so that the pressure in the process chamber 201 can be regulated by adjusting the valve opening degree based on the pressure information detected by the pressure sensor 245 in a state in which the vacuum pump 246 is operated. An exhaust system is mainly constituted by the exhaust pipe 231, the APC valve 244 and the pressure sensor 245. The vacuum pump 246 may be included in the exhaust system. The exhaust pipe 231 is not limited to being installed in the reaction tube 203 and may be installed in the manifold 209 just like the nozzles 249a and 249b.

A seal cap 219 as a furnace opening lid capable of airtightly closing the lower end opening of the manifold 209 is installed below the manifold 209. The seal cap 219 is configured to make contact with the lower end of the manifold 209 from the lower side in the vertical direction. The seal cap 219 is made of a metal such as, for example, SUS or the like and is formed in a disc shape. On an upper surface of the seal cap 219, there is installed an O ring 220b as a seal member which makes contact with the lower end of the manifold 209. On the side of the seal cap 219 opposite to the process chamber 201, there is installed a rotation mechanism 267 for rotating a boat 217 to be described later. A rotating shaft 255 of the rotating mechanism 267 passes through the seal cap 219 and is connected to the boat 217. The rotation mechanism 267 is configured to rotate the wafers 200 by rotating the boat 217. The seal cap 219 is configured to be raised and lowered in the vertical direction by a boat elevator 115 as an elevating mechanism vertically installed outside the reaction tube 203. The boat elevator 115 is configured to load and unload the boat 217 into and from the process chamber 201 by raising and lowering the seal cap 219. The boat elevator 115 is configured as a transfer device (transfer mechanism) for transferring the boat 217, i.e., the wafers 200 into and from the process chamber 201. Furthermore, under the manifold 209, there is installed a shutter 219s as a furnace opening lid capable of airtightly closing the lower end opening of the manifold 209 while lowering the seal cap 219 by the boat elevator 115. The shutter 219s is made of a metal such as, for example, SUS or the like and is formed in a disk shape. On the upper surface of the shutter 219s, there is installed an O-ring 220c as a seal member which makes contact with the lower end of the manifold 209. The opening/closing operations (the elevating operation, the rotating operation and the like) of the shutter 219s are controlled by a shutter opening/closing mechanism 115s.

(Substrate Support Tool)

As shown in FIG. 1, the boat 217 as a substrate support tool is configured so as to support a plurality of wafers 200, for example, 25 to 200 wafers 200 at multiple stages in a horizontal posture and in a vertically-aligned state with their centers aligned with one another, namely so as to arrange the wafers 200 at predetermined intervals. The boat 217 is made of a heat-resistant material such as, for example, quartz or SiC. Heat insulating plates 218 made of a heat-resistant material such as, for example, quartz or SiC are disposed at multiple stages in the lower portion of the boat 217.

As shown in FIG. 2, in the reaction tube 203, there is installed a temperature sensor 263 as a temperature detector. By adjusting a condition of electrical conduction to the heater 207 based on the temperature information detected by the temperature sensor 263, the temperature inside the process chamber 201 is controlled to have a desired temperature distribution. The temperature sensor 263 is installed along the inner wall of the reaction tube 203 just like the nozzles 249a and 249b.

(Control Device)

Figure 4:
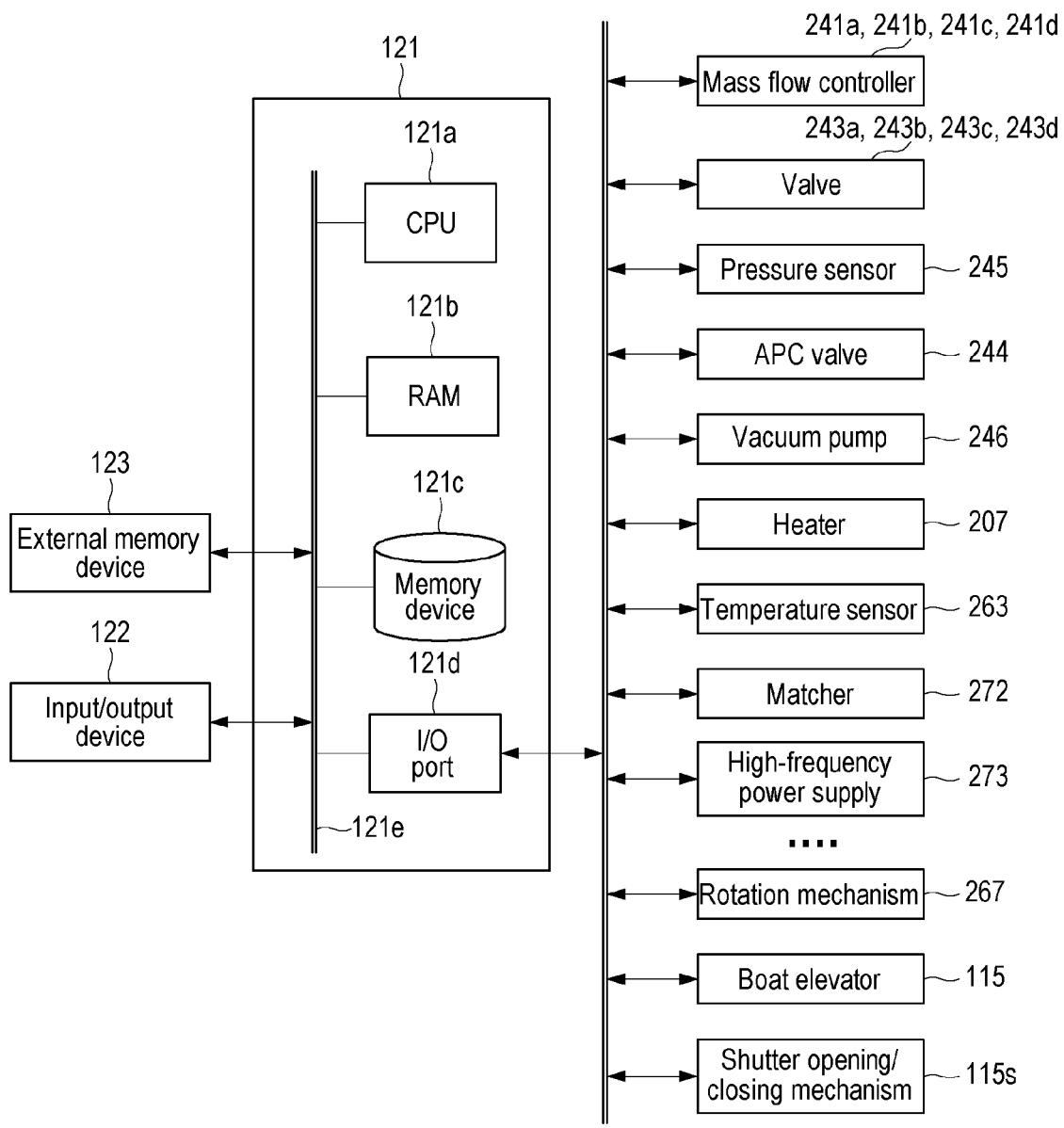
FIG. 4 is a schematic configuration diagram of a controller of a substrate processing apparatus suitably used in an embodiment of the present disclosure, in which a control system of the controller is shown in a block diagram.

Next, the control device will be described with reference to FIG. 4. As shown in FIG. 4, the controller 121 as a control part (control device) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 formed of, for example, a touch panel or the like is connected to the controller 121.

The memory device 121c is configured by, for example, a flash memory, a hard disc drive (HDD), or the like. A control program for controlling the operations of the substrate processing apparatus, a process recipe in which sequences and conditions of a film-forming process to be described later are written, and the like are readably stored in the memory device 121c. The process recipe functions as a program for causing the controller 121 to execute each sequence in various processes (film-forming process), which will be described later, to obtain a predetermined result. Hereinafter, the process recipe and the control program will be generally and simply referred to as a "program." Further, the process recipe is simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the matcher 272, the high-frequency power supply 273, the rotation mechanism 267, the boat elevator 115, the shutter opening/closing mechanism 115s, and the like.

The CPU 121a is configured to read the control program from the memory device 121c and execute the same. The CPU 121a is also configured to read the process recipe from the memory device 121c according to an input of an operation command from the input/output device 122. The CPU 121a is configured to control, according to the contents of the process recipe thus read, the operation of the rotation mechanism 267, the flow rate adjustment operation of various gases by the MFCs 241a to 241d, the opening/closing operation of the valves 243a to 243d, the adjustment operation of the high-frequency power supply 273 based on impedance monitoring, the opening/closing operation of the APC valve 244, the pressure regulation operation performed by the APC valve 244 based on the pressure sensor 245, the driving and stopping of the vacuum pump 246, the temperature adjustment operation performed by the heater 207 based on the temperature sensor 263, the adjustment operation of the forward and reverse rotation, the rotation angle and rotation speed of the boat 217 by the rotation mechanism 267, the operation of raising and lowering the boat 217 with the boat elevator 115, and the like.

The controller 121 may be configured by installing, in a computer, the above-described program stored in an external memory device (e.g., a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a computer-readable recording medium.

Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate Processing Process

Figure 5:
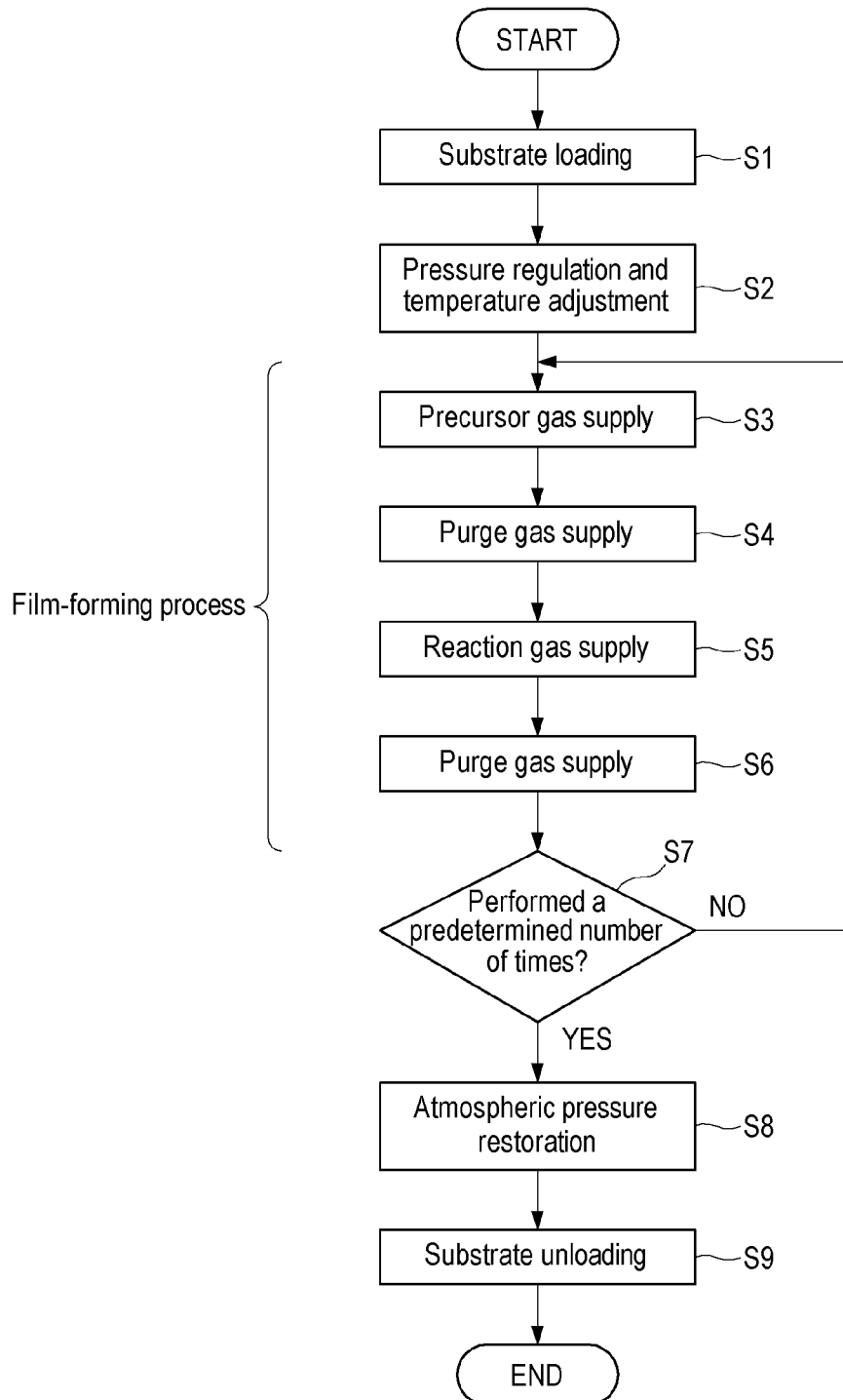
FIG. 5 is a flowchart of a substrate processing process according to an embodiment of the present disclosure.
Figure 6:
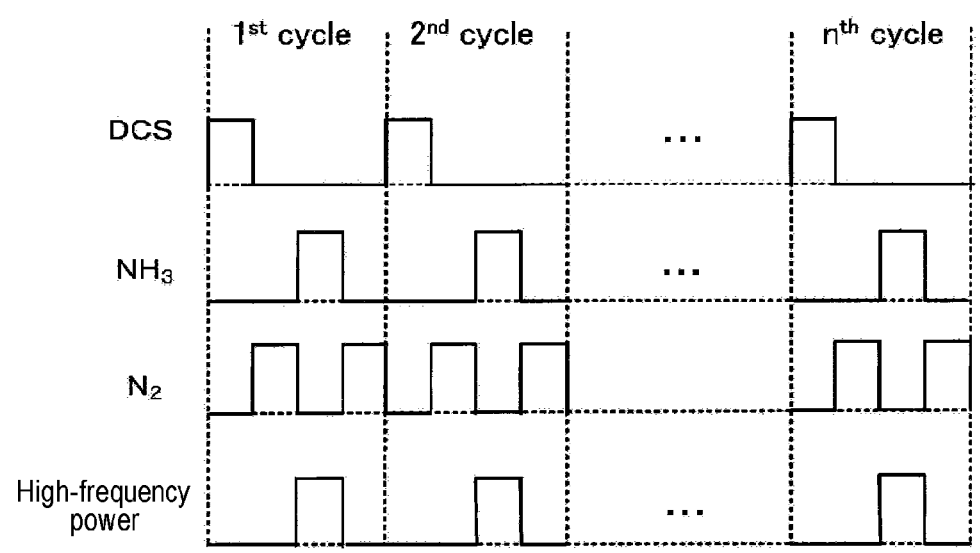
FIG. 6 is a diagram showing the gas supply timing in a substrate processing process according to an embodiment of the present disclosure.

Next, a process of forming a thin film on a wafer 200 using the substrate processing apparatus 100 will be described as a semiconductor device manufacturing process with reference to FIGS. 5 and 6. In the following description, the operations of the respective parts constituting the substrate processing apparatus are controlled by the controller 121.

Description will now be made on an example where a silicon nitride film (SiN film) as a film containing Si and N is formed on a wafer 200 by performing a step of supplying a DCS gas as a precursor gas and a step of supplying a plasma-excited NH$_3$ gas as a reaction gas, a predetermined number of times (one or more times), in a non-simultaneous manner, i.e., without synchronization. Moreover, for example, a predetermined film may be formed in advance on the wafer 200. In addition, a predetermined pattern may be formed in advance on the wafer 200 or the predetermined film.

In this specification, the process flow of the film-forming process shown in FIG. 6 may be denoted as follows for the sake of convenience. Similar notations are also used in the following modifications and other embodiments.

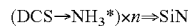

(DCS→NH$_3$*)×n⇒SiN

When the term "wafer" is used herein, it may refer to a wafer itself or a laminated body of a wafer and a predetermined layer or film formed on the surface of the wafer. Furthermore, when the phrase "a surface of a wafer" is used herein, it may refer to a surface of a wafer itself or a surface of a predetermined layer or the like formed on a wafer. Moreover, the expression "a predetermined layer is formed on a wafer" as used herein may mean that a predetermined layer is directly formed on a surface of a wafer itself or that a predetermined layer is formed on a layer or the like formed on a wafer. In addition, when the term "substrate" is used herein, it may be synonymous with the term "wafer."

(Loading Step: S1)

When a plurality of wafers 200 is charged on the boat 217 (wafer charging), the shutter 219s is moved by the shutter opening/closing mechanism 115s to open the lower end opening of the manifold 209 (shutter open). Thereafter, as shown in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation/Temperature Adjustment Step: S2)

The interior of the process chamber 201, namely the space in which the wafers 200 exist, is vacuum-evacuated (pressure-reducing exhaust) by the vacuum pump 246 so as to reach a desired pressure (degree of vacuum). At this time, the pressure in the process chamber 201 is measured by the pressure sensor 245. The APC valve 244 is feedback-controlled based on the measured pressure information. The vacuum pump 246 is kept operated at least until the film-forming step described later is completed.

Further, the wafer 200 in the process chamber 201 is heated by the heater 207 so as to have a desired temperature. At this time, the condition of conductance to the heater 207 is feedback-controlled based on the temperature information detected by the temperature sensor 263 so that the inside of the process chamber 201 has a desired temperature distribution. The heating of the inside of the process chamber 201 by the heater 207 is continuously performed at least until the film-forming step to be described later is completed. However, in the case where the film-forming step is performed under a temperature condition of room temperature or lower, the heating of the inside of the process chamber 201 by the heater 207 may not be performed. When only the processing at such a temperature is performed, the heater 207 is unnecessary and the heater 207 may not be installed in the substrate processing apparatus. In this case, it is possible to simplify a configuration of the substrate processing apparatus.

Subsequently, the rotation of the boat 217 and the wafer 200 by the rotation mechanism 267 is started. The rotation of the boat 217 and the wafer 200 by the rotation mechanism 267 is continuously performed at least until the film-forming step is completed.

(Film-Forming Step: S3, S4, S5 and S6)

Thereafter, a film-forming step is performed by sequentially executing steps S3, S4, S5 and S6.

(Precursor Gas Supply Step: S3 and S4)

In step S3, a DCS gas is supplied to the wafer 200 in the process chamber 201.

The valve 243a is opened, and the DCS gas is allowed to flow into the gas supply pipe 232a. A flow rate of the DCS gas is adjusted by the MFC 241a. The DCS gas is supplied from the gas supply holes 250a into the process chamber 201 via the nozzle 249a and is exhausted from the exhaust pipe 231. At the same time, the valve 243c is opened to allow an N$_2$ gas to flow into the gas supply pipe 232c. A flow rate of the N$_2$ gas is adjusted by the MFC 241c. The N$_2$ gas is supplied into the process chamber 201 together with the DCS gas and is exhausted from the exhaust pipe 231.

In order to suppress an intrusion of the DCS gas into the nozzle 249b, the valve 243d is opened to allow an N$_2$ gas to flow into the gas supply pipe 232d. The N$_2$ gas is supplied into the process chamber 201 via the gas supply pipe 232b and the nozzle 249b and is exhausted from the exhaust pipe 231.

A supply flow rate of the DCS gas controlled by the MFC 241a is set to a flow rate falling within a range of, for example, 1 sccm or more and 6000 sccm or less, preferably 2000 sccm or more and 3000 sccm or less. A supply flow rate of the N$_2$ gas controlled by the MFCs 241c and 241d is set to a flow rate falling within a range of, for example, 100 sccm or more and 10000 sccm or less. A pressure in the process chamber 201 is set to a pressure falling within a range of, for example, 1 Pa or more and 2666 Pa or less, preferably 665 Pa or more and 1333 Pa or less. A time for exposing the wafer 200 to the DCS gas is set to a time falling within a range of, for example, 1 second or more and 10 seconds or less, preferably 1 second or more and 3 seconds or less.

A temperature of the heater 207 is set so that a temperature of the wafer 200 becomes a temperature falling within a range of, for example, 0 degrees C. or more and 700 degrees C. or less, preferably a room temperature (25 degrees C.) or more and 550 degrees C. or less, more preferably 40 degrees C. or more and 500 degrees C. or less. By setting the temperature of the wafer 200 to 700 degrees C. or less, specifically 550 degrees C. or less, or more specifically 500 degrees C. or less as in the present embodiment, it is possible to reduce an amount of heat applied to the wafer 200 and to satisfactorily control a thermal history undergone by the wafer 200.

By supplying the DCS gas to the wafer 200 under the above-mentioned conditions, a Si-containing layer having a thickness of, for example, from less than one atomic layer (one molecular layer) to several atomic layers (several molecular layers) is formed on the wafer 200 (a base film on its surface). The Si-containing layer may be a Si layer, may be a DCS adsorption layer or may include both.

As referred to herein, a layer having a thickness of less than one atomic layer (one molecular layer) means an atomic layer (molecular layer) formed discontinuously, and a layer having a thickness of one atomic layer (one molecular layer) means an atomic layer (molecular layer) formed continuously. The Si-containing layer may include both the Si layer and the DCS adsorption layer. However, as described above, the expression "one atomic layer", "several atomic layers" or the like is used for the Si-containing layer. The "atomic layer" is used synonymously with the "molecular layer."

When the thickness of the Si-containing layer formed on the wafer 200 exceeds several atomic layers, a modifying action in a modifying process described later does not reach the entire Si-containing layer. Furthermore, a minimum value of the thickness of the Si-containing layer that can be formed on the wafer 200 is less than one atomic layer. Therefore, it is preferable that the thickness of the Si-containing layer is from less than one atomic layer to several atomic layers.

After the Si-containing layer is formed, the valve 243a is closed, and the supply of the DCS gas into the process chamber 201 is stopped. At this time, the APC valve 244 is kept opened, the inside of the process chamber 201 is vacuum-evacuated by the vacuum pump 246, and the DCS gas unreacted or contributed to the formation of the Si-containing layer, the reaction byproduct and the like, which remain in the process chamber 201, are removed from the process chamber 201 (S4). Furthermore, the valves 243c and 243d are kept opened, and the supply of the $N_2$ gas into the process chamber 201 is maintained. The $N_2$ gas acts as a purge gas. This step S4 may be omitted.

As the precursor gas, in addition to the DCS gas, it may be possible to suitably use: various aminosilane precursor gases such as a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdimethylaminosilane ($Si[N(CH_3)_2]_2H_2$, abbreviation: BDMAS) gas, a bisdiethylaminosilane ($Si[N(C_2H_5)_2]_2H_2$, abbreviation: BDEAS) gas, a bis-tertiary-butyl aminosilane ($SiH_2[NH(C_4H_9)]_2$, abbreviation: BTBAS) gas, a dimethylaminosilane (DMAS) gas, a diethylaminosilane (DEAS) gas, a dipropylaminosilane (DPAS) gas, a diisopropylaminosilane (DIPAS) gas, a butylaminosilane (BAS) gas, a hexamethyldisilazane (HMDS) gas and the like; inorganic halosilane precursor gases such as a monochlorosilane ($SiH_3Cl$, abbreviation: MCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas and the like; and halogen-group-free inorganic silane precursor gases such as a monosilane ($SiH_4$, abbreviation: MS) gas, a disilane ($Si_2H_6$, abbreviation: DS) gas, a trisilane ($Si_3H_8$, Abbreviation: TS) gas and the like.

As the inert gas, in addition to the $N_2$ gas, it may be possible to use a rare gas such as an Ar gas, a He gas, an Ne gas, a Xe gas or the like.

(Reaction Gas Supply Step: S5 and S6)

After the film-forming process is finished, a plasma-excited $NH_3$ gas as a reaction gas is supplied to the wafer 200 in the process chamber 201 (S5).

In this step, opening and closing control of the valves 243b to 243d is performed in the same procedure as opening and closing control of the valves 243a, 243c and 243d in step S3. A flow rate of the $NH_3$ gas is adjusted by the MFC 241b. The $NH_3$ gas is supplied into the buffer chamber 237 via the nozzle 249b. At this time, high-frequency power is supplied between the rod-shaped electrodes 269, 270 and 271. The $NH_3$ gas supplied into the buffer chamber 237 is excited into a plasma state (activated into plasma). The excited the $NH_3$ gas is supplied into the process chamber 201 as active species ($NH_3$*) and is exhausted from the exhaust pipe 231.

A supply flow rate of the $NH_3$ gas controlled by the MFC 241b is set to a flow rate falling within a range of, for example, 100 sccm or more and 10000 sccm or less, preferably 1000 sccm or more and 2000 sccm or less. The high-frequency power applied to the rod-shaped electrodes 269, 270 and 271 is set to electric power falling within a range of, for example, 50 W or more and 600 W or less. The pressure in the process chamber 201 is set to a pressure falling within a range of, for example, 1 Pa or more and 500 Pa or less. By using plasma, it is possible to activate the $NH_3$ gas even if the pressure in the process chamber 201 is set to fall within such a relatively low pressure band. A time during which the active species obtained by exciting the $NH_3$ gas with plasma is supplied to the wafer 200, i.e., the gas supply time (irradiation time) is set to a time falling within a range of, for example, 1 second or more and 180 seconds or less, preferably 1 second or more and 60 seconds or less. Other processing conditions are the same processing conditions as those of S3 described above.

By supplying the $NH_3$ gas to the wafer 200 under the above-mentioned conditions, the Si-containing layer formed on the wafer 200 is plasma-nitrided. At this time, the Si—Cl bond and the Si—H bond of the Si-containing layer are broken by an energy of the plasma-excited $NH_3$ gas. Cl and H whose bonds with Si are broken are desorbed from the Si-containing layer. Then, Si in the Si-containing layer which has a dangling bond due to desorption of Cl or the like is bonded to N contained in the $NH_3$ gas, thereby forming a Si—N bond. As the reaction goes forward, the Si-containing layer is changed (modified) to a layer containing Si and N, i.e., a silicon nitride layer (SiN layer).

In order to modify the Si-containing layer into the SiN layer, the $NH_3$ gas needs to be plasma-excited and supplied. This is because, even if the $NH_3$ gas is supplied in a non-plasma atmosphere, an energy necessary for nitriding the Si-containing layer is insufficient in the aforementioned temperature range. This makes it difficult to sufficiently desorb Cl or H from the Si-containing layer or to sufficiently nitride the Si-containing layer to increase Si—N bonds.

After changing the Si-containing layer to an SiN layer, the valve 243b is closed and the supply of the $NH_3$ gas is stopped. Furthermore, supply of the high-frequency power to the rod-shaped electrodes 269, 270 and 271 is stopped. Then, the $NH_3$ gas and the reaction byproducts remaining in the process chamber 201 are eliminated from the inside of the process chamber 201 (S6) by the same processing procedure and processing conditions as those of step S4. This step S6 may be omitted.

As the nitriding agent, i.e., the $NH_3$-containing gas to be plasma-excited, in addition to the $NH_3$ gas, it may be possible to use a diazene ($N_2H_2$) gas, a hydrazine ($N_2H_4$) gas, an $N_3H_8$ gas or the like.

As the inert gas, in addition to the $N_2$ gas, it may be possible to use, for example, various rare gases exemplified in step S4.

(Performed a Predetermined Number of Times: S7)

By performing, a predetermined number of times (n times), i.e., one or more times, a cycle in which the aforementioned steps S3, S4, S5 and S6 are performed in a non-simultaneous manner, i.e., without synchronization, in the named order (S7), it is possible to form a SiN film having a predetermined composition and a predetermined film thickness on the wafer 200. The aforementioned cycle is preferably repeated a plurality of times. That is, the thickness of the SiN layer formed per cycle is set smaller than a desired film thickness, and the aforementioned cycle is preferably repeated a plurality of times until the film thickness of the SiN film formed by stacking the SiN layer becomes the desired film thickness.

(Atmospheric Pressure Restoration Step: S8)

When the above-described film-forming process is completed, an $N_2$ gas as an inert gas is supplied into the process chamber 201 from each of the gas supply pipes 232c and 232d, and is exhausted from the exhaust pipe 231. As a result, the interior of the process chamber 201 is purged with the inert gas, and the gas or the like remaining in the process chamber 201 is removed from the inside of the process chamber 201 (inert gas purge). Thereafter, the atmosphere in the process chamber 201 is replaced with the inert gas (inert gas replacement), and the pressure in the process chamber 201 is restored to the atmospheric pressure (S8).

(Unloading Step: S9)

Thereafter, the seal cap 219 is lowered by the boat elevator 115, the lower end of the manifold 209 is opened, and the processed wafers 200 are unloaded from the lower end of the manifold 209 to the outside of the reaction tube 203 while being supported by the boat 217 (boat unloading) (S9). After the boat unloading, the shutter 219s is moved, and the lower end opening of the manifold 209 is sealed by the shutter 219s via the O ring 220c (shutter closing). After the processed wafers 200 are unloaded to the outside of the reaction tube 203, they are taken out from the boat 217 (wafer discharging). After the wafer discharging, an empty boat 217 may be loaded into the process chamber 201.

(3) Effects of the Present Embodiment

According to the present embodiment, one or more of the following effects may be obtained.

(a) According to the present embodiment, by using a plurality of electrodes, it is possible to increase an electrode area and to increase generation amount of active species to be supplied to a wafer surface, thereby increasing the amount of active species supplied to the wafer surface.

(b) According to the present embodiment, by using a plurality of electrodes, it is possible to reduce an output, thus suppressing the generation of particles.

(c) According to the present embodiment, by setting the number of electrodes to an odd number and allowing the electrode on the ground side to be shared by the electrodes on the high-frequency power supply side, it is possible to reduce an installation space as compared with a case where even number of electrodes are used.

(d) According to the present embodiment, by installing three electrodes in the buffer chamber, it is possible to form two plasma generation regions. By forming the gas supply ports at the positions (between the electrodes) corresponding to the plasma generation regions, it is possible to increase the supply amount of active species to be supplied to the wafer surface. As a result, it becomes possible to form a film in a short time and to improve the throughput.

(e) By installing the plasma generation part in the buffer chamber, it is possible to supply some active species even to an outside of the buffer chamber, thereby improving an in-plane uniformity of the wafer.

(Modification 1)

Figure 7:
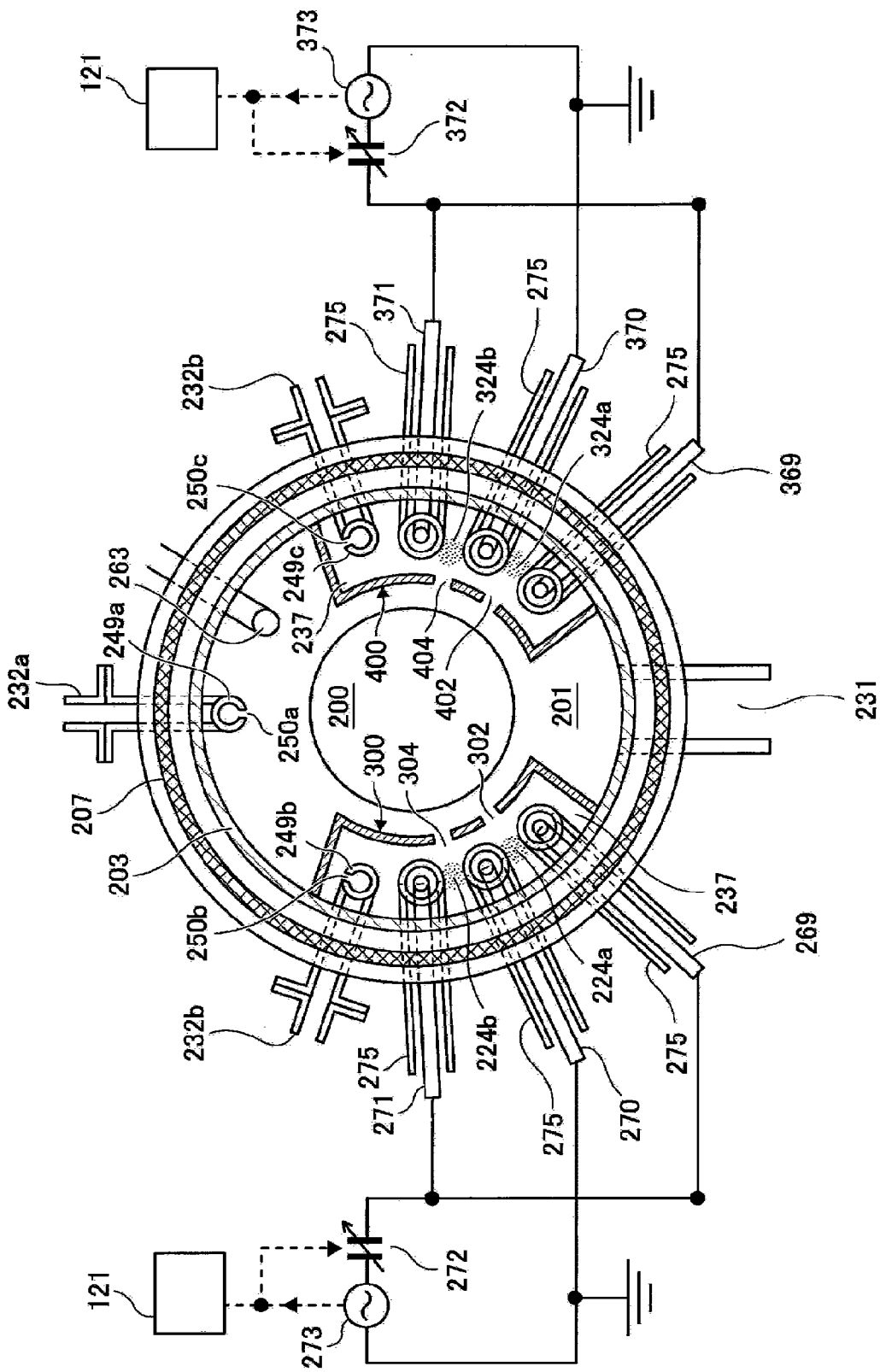
FIG. 7 is a schematic horizontal sectional view for explaining modification 1 of the vertical process furnace of the substrate processing apparatus suitably used in the embodiment of the present disclosure.

Next, a modification of the present embodiment will be described with reference to FIG. 7. In this modification, only the portions different from those of the above-described embodiment will be described below, and the same portions will not be described.

In the above-described embodiment, there has been specifically described the configuration in which the buffer structure 300 is installed on the inner wall of the reaction tube 203 and the rod-shaped electrodes 269, 270 and 271 respectively covered with the electrode protection tubes 275 and the nozzle 249b are installed inside the buffer structure 300. In this modification, however, a buffer structure 400 having the same configuration as the buffer structure 300 is further installed on the inner wall of the reaction tube 203.

On the inner side of the buffer structure 400, rod-shaped electrodes 369, 370 and 371 respectively covered with electrode protection tubes 275 and a nozzle 249c are installed. The rod-shaped electrodes 369 and 371 disposed at both ends among the rod-shaped electrodes 369, 370 and 371 are connected to a high-frequency power supply 373 via a matcher 372, and the rod-shaped electrode 370 is grounded by being connected to the ground which is a reference potential. The nozzle 249c is connected to the gas supply pipe 232b and can supply the same gas as the nozzle 249b. On the side surface of the nozzle 249c, a plurality of gas supply holes 250c for supplying a gas is formed from the lower portion to the upper portion of the reaction tube 203. The gas supply holes 250c are opened so as to face the wall surface extending in a radial direction with respect to the wall surface of the buffer structure 400 formed in a circular arc shape. The gas supply holes 250c can supply the gas toward the wall surface. Gas supply ports 402 and 404 for supplying the gas in the buffer chamber 237 are formed on the arc-shaped wall surface of the buffer structure 400. The gas supply ports 402 and 404 are opened so as to face the center of the reaction tube 203 respectively at positions facing plasma generation regions 324a and 324b between the rod-shaped electrodes 369 and 370 and between the rod-shaped electrodes 370 and 371. A plurality of the gas supply ports 402 and 404 are formed from the lower portion to the upper portion of the reaction tube 203. The respective gas supply ports 402 and 404 have the same opening area and are formed at the same opening pitch.

The buffer structure 300 and the buffer structure 400 are installed, with the exhaust pipe 231 interposed therebetween, in a line-symmetrical manner with respect to a line passing through the exhaust pipe 231 and a center of the reaction tube 203. Furthermore, the nozzle 249a is installed at a position facing the exhaust pipe 231 across the wafers 200. In addition, the nozzle 249b and the nozzle 249c are installed at positions distant from the exhaust pipe 231 in the buffer chamber 237.

In this modification, two buffer structures each having a plasma generation part are installed. The respective buffer structures 300 and 400 are provided with high-frequency power supplies 273 and 373 and matchers 272 and 372, respectively. The respective high-frequency power supplies 273 and 373 are connected to the controller 121 so that plasma control can be performed for each of the buffer chambers 237 of the buffer structures 300 and 400. That is, the controller 121 monitors impedances of the respective plasma generation parts and independently controls the respective high-frequency power supplies 273 and 373 so as to prevent occurrence of a bias in the active species amount for each buffer chamber 237. When the impedance is large, the electric power of the high-frequency power supplies is controlled to become high. As a result, a sufficient amount of active species can be supplied to the wafer even if the high-frequency power of each plasma generation part is reduced as compared with a case of using only one plasma generation part, and the in-plane uniformity of the wafer. Furthermore, instead of performing plasma control for two plasma generation parts by one high-frequency power supply, the high-frequency power supply is installed for each plasma generation part. Therefore, it is possible to easily grasp an abnormality such as disconnection or the like occurring in each plasma generation part. Moreover, it is easy to adjust the distance between the high-frequency power supply and each electrode. Therefore, it is possible to easily suppress the difference in RF power application caused by the difference in distance between each electrode and the high-frequency power supply.

(Modification 2)

Figure 8:
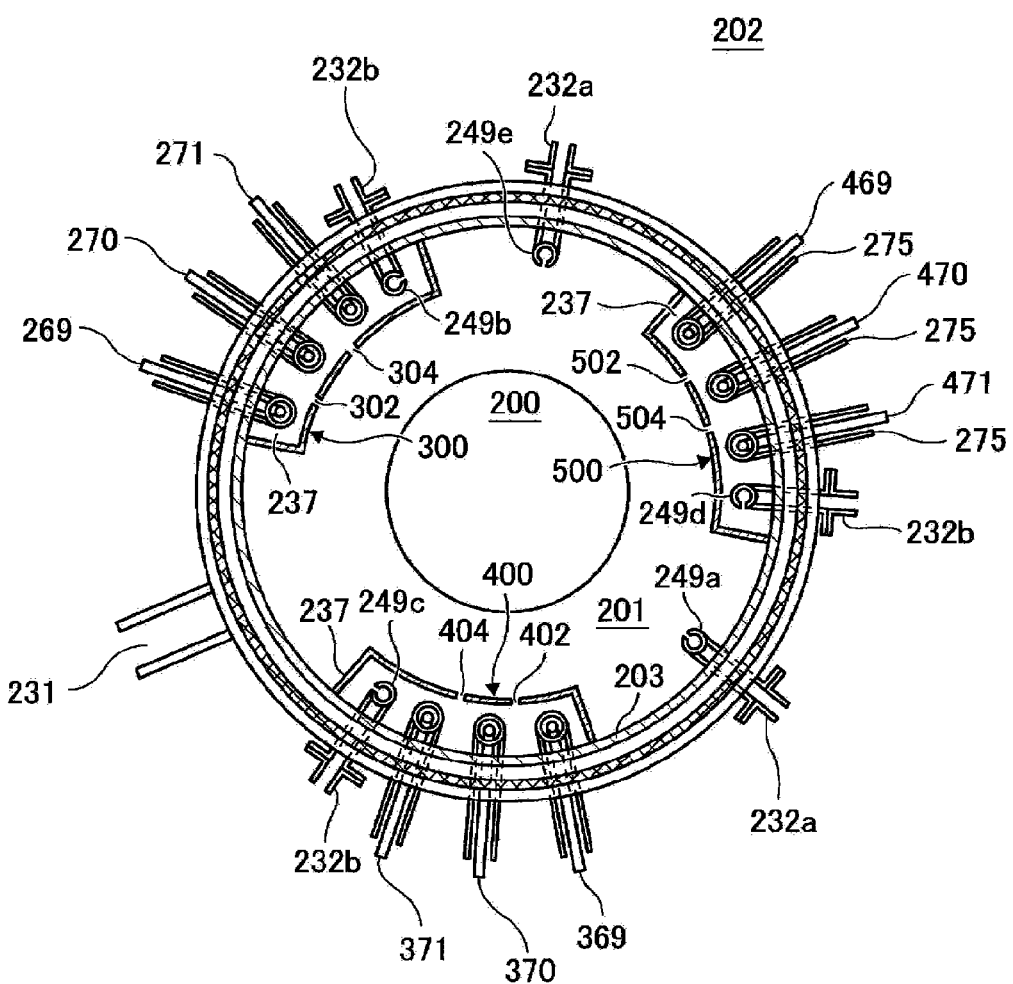
FIG. 8 is a schematic horizontal sectional view for explaining modification 2 of the vertical process furnace of the substrate processing apparatus suitably used in the embodiment of the present disclosure.

Next, modification 2 of the present embodiment will be described with reference to FIG. 8. In modification 2, three buffer structures each having a plasma generation part are installed on the inner wall of the reaction tube 203, and two nozzles for supplying a precursor gas are installed.

As in the buffer structures 300 and 400, rod-shaped electrodes 469, 470 and 471 covered with electrode protection tubes 275 and a nozzle 249d are installed inside a buffer structure 500. The rod-shaped electrodes 469 and 471 are connected to a high-frequency power supply via a matcher (not shown), and the rod-shaped electrode 470 is grounded by being connected to the ground which is a reference potential. The nozzle 249d is connected to the gas supply pipe 232b and can supply the same gas as the gas supplied through the nozzle 249b. Gas supply ports 502 and 504 for supplying a gas are installed between the electrodes on the arc-shaped wall surface of the buffer structure 500. The gas supply ports 502 and 504 are opened so as to face the center of the reaction tube 203 respectively at the positions facing the plasma generation regions between the rod-shaped electrodes 469 and 470 and between the rod-shaped electrodes 470 and 471. A plurality of the gas supply ports 502 and 504 are formed from the lower portion to the upper portion of the reaction tube 203. The respective gas supply ports 502 and 504 have the same opening area and are formed at the same opening pitch. In addition, the nozzle 249e is connected to the gas supply pipe 232a and can supply the same gas as the gas supplied through the nozzle 249a.

The buffer structure 300 and the buffer structure 400 are installed, with the exhaust pipe 231 interposed therebetween, in a line-symmetrical manner with respect to a line passing through the exhaust pipe 231 and the center of the reaction tube 203. Furthermore, the buffer structure 500 is installed at a position facing the exhaust pipe 231 with the wafer 200 interposed therebetween. The nozzles 249a and 249e for supplying a precursor gas are installed between the buffer structure 300 and the buffer structure 500 and between the buffer structure 400 and the buffer structure 500, respectively. The nozzles 249b, 249c and 249d for supplying a reaction gas are respectively disposed on the same side in the buffer chamber 237. The gas supply holes of the nozzles 249b, 249c and 249d are opened so as to face the wall surface extending in the radial direction with respect to the arc-shaped wall surface of each of the buffer structures 300, 400 and 500.

According to modification 2, effects similar to those of the above-described embodiment and modification 1 may be obtained.

(Modification 3)

Figure 9:
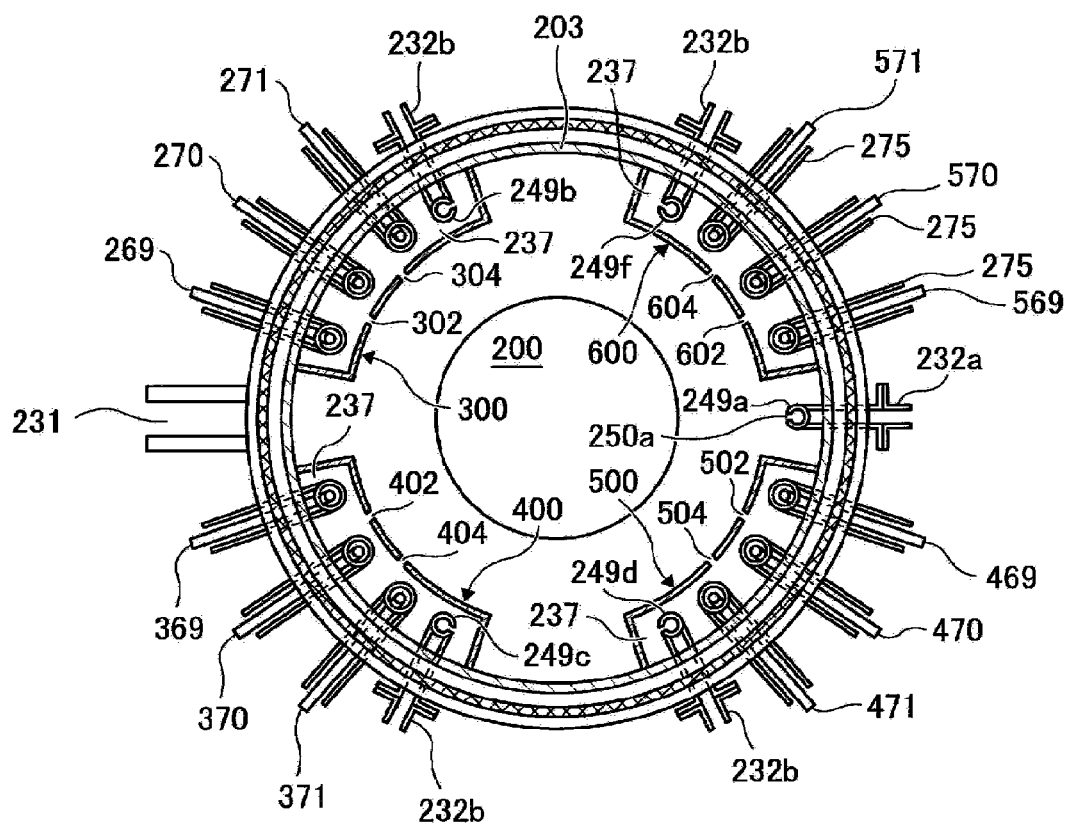
FIG. 9 is a schematic horizontal sectional view for explaining modification 3 of the vertical process furnace of the substrate processing apparatus suitably used in the embodiment of the present disclosure.

Next, modification 3 of the present embodiment will be described with reference to FIG. 9. In modification 3, four buffer structures each having a plasma generation part are installed on the inner wall of the reaction tube 203.

As in the buffer structures 300, 400 and 500, rod-shaped electrodes 569, 570 and 571 respectively covered with electrode protection tubes 275 and a nozzle 249f are installed in the buffer structure 600. The rod-shaped electrodes 569 and 571 are connected to a high-frequency power supply via a matcher (not shown), and the rod-shaped electrode 570 is grounded by being connected to the ground which is a reference potential. The nozzle 249f is connected to the gas supply pipe 232b and can supply the same gas as the gas supplied through the nozzle 249b. Gas supply ports 602 and 604 for supplying a gas are installed between the electrodes on the arc-shaped wall surface of the buffer structure 600. The gas supply ports 602 and 604 are opened so as to face the center of the reaction tube 203 respectively at the positions facing the plasma generation regions between the rod-shaped electrodes 569 and 570 and between the rod-shaped electrodes 570 and 571. A plurality of the gas supply ports 602 and 604 are formed from the lower portion to the upper portion of the reaction tube 203. The respective gas supply ports 602 and 604 have the same opening area and are formed at the same opening pitch.

The buffer structures 300, 400, 500 and 600 are installed at regular intervals. The nozzle 249a is installed at a position facing the exhaust pipe 231 with the wafer 200 interposed therebetween. The nozzle 249b and the nozzle 249c are respectively installed on the side farther from the exhaust pipe 231 in the buffer chamber 237. The nozzle 249d and the nozzle 249f are installed on the exhaust pipe 231 side in the buffer chamber 237. The gas supply holes of the nozzle 249b, the nozzle 249c, the nozzle 249d and the nozzle 249f are opened so as to face the wall surface extending in the radial direction with respect to the arc-shaped wall surface of each of the buffer structures 300, 400, 500 and 600.

According to modification 3, effects similar to those of the above-described embodiment and modification 1 may be obtained.

Another Embodiment of the Present Disclosure

Figure 10:
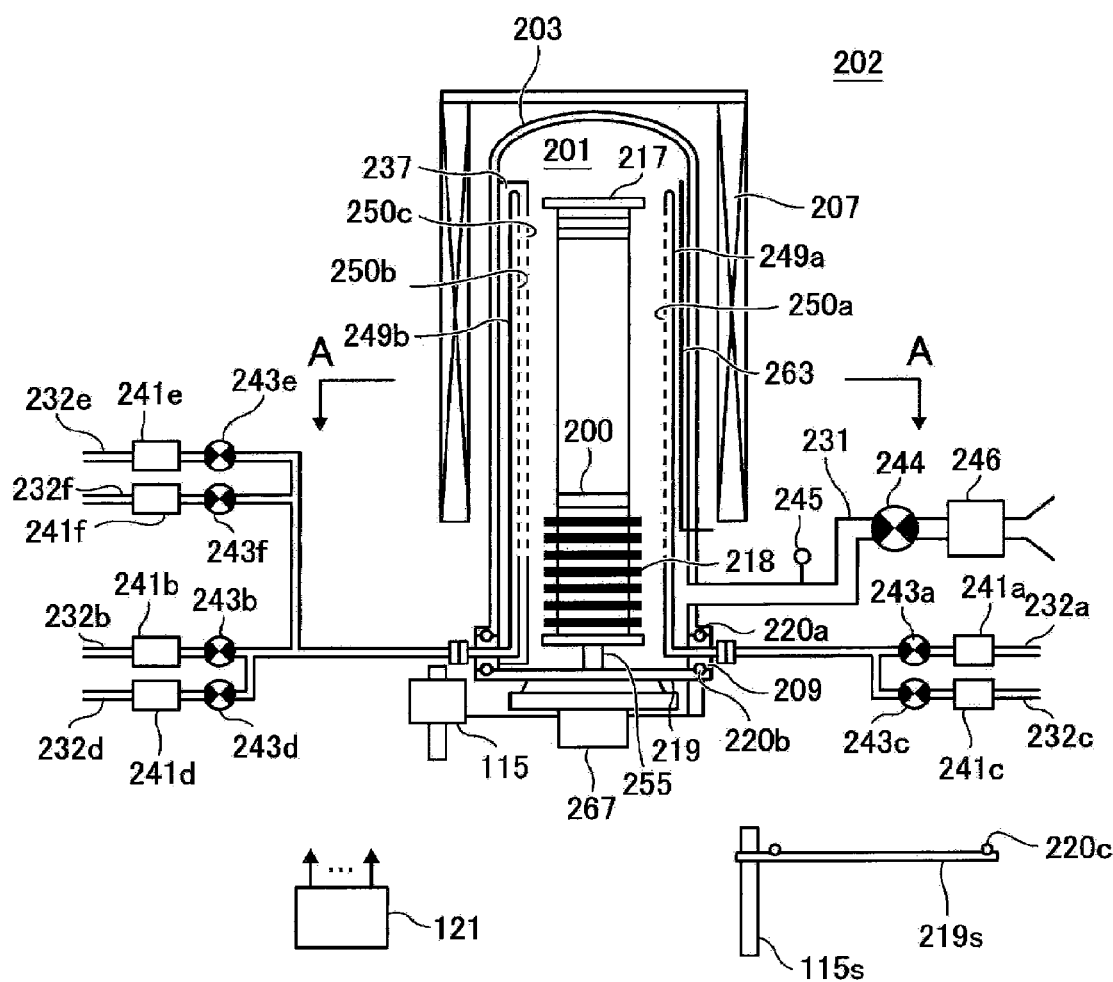
FIG. 10 is a schematic configuration diagram of a vertical process furnace of a substrate processing apparatus suitably used in another embodiment of the present disclosure, in which the process furnace is shown in a vertical sectional view.

Next, another embodiment of the present disclosure will be described with reference to FIGS. 10 and 11. In this embodiment, only the parts different from the above-described embodiment will be described below, and the same parts will not be described.

In the present embodiment, a gas supply pipe 232e for supplying a modifying gas is connected to the gas supply pipe 232b on the downstream side of the valve 243b. On the gas supply pipe 232e, an MFC 241e and a valve 243e are installed sequentially from the upstream side of a gas flow. A gas supply pipe 232f for supplying an inert gas is connected to the gas supply pipe 232e on the downstream side of the valve 243e. On the gas supply pipe 232f, an MFC 241f and a valve 243f are installed sequentially from the upstream side of a gas flow.

From the gas supply pipe 232e, a modifying gas, for example, a hydrogen ($H_2$) gas is supplied into the process chamber 201 via the MFC 241e, the valve 243e, the gas supply pipe 232b and the nozzle 249b. From the gas supply pipe 232f, an inert gas, for example, a nitrogen ($N_2$) gas is supplied into the process chamber 201 via the MFC 241f, the valve 243f, the gas supply pipe 232b and the nozzle 249b.

Figure 11:
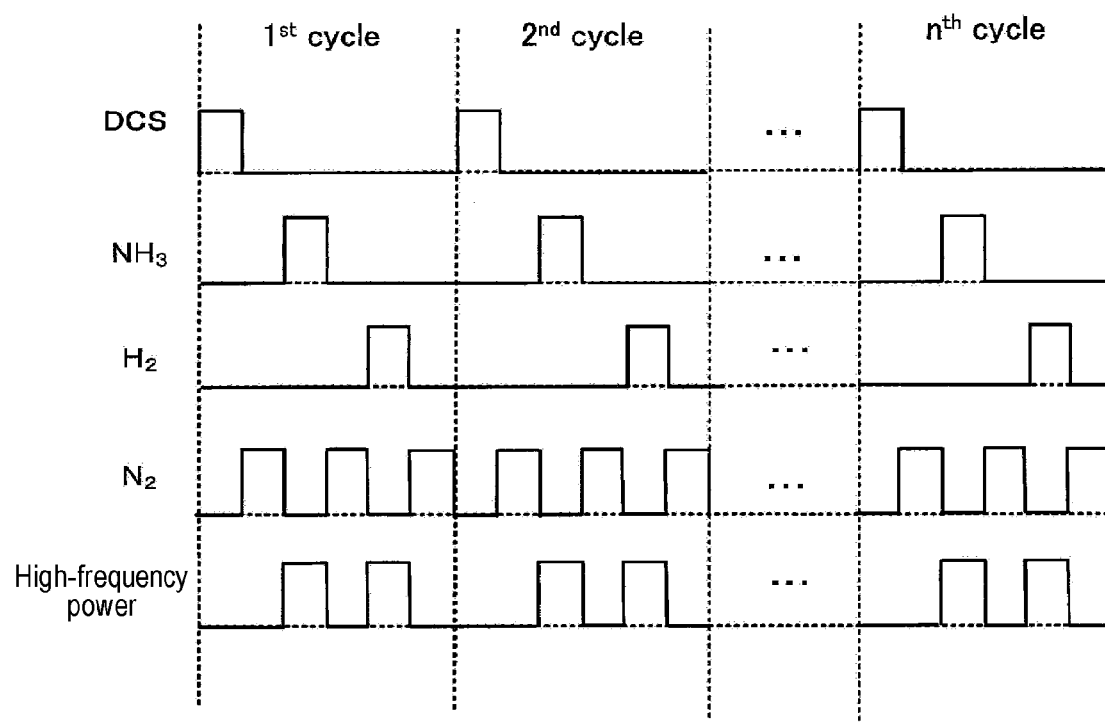
FIG. 11 is a diagram showing the gas supply timing in a substrate processing process according to another embodiment of the present disclosure.

Then, as shown in FIG. 11, a silicon nitride film (SiN film) as a film containing Si and N is formed on the wafer 200 by performing a step of supplying a DCS gas as a precursor gas, a step of supplying a plasma-excited NH$_3$ gas as a reaction gas and a step of supplying a plasma-excited H$_2$ gas as a modifying gas, a predetermined number of times (one or more times), in a non-simultaneous manner, i.e., without synchronization.

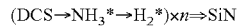

(DCS→NH$_3$*→H$_2$*)×n ⇒ SiN

As described above, the present disclosure may also be applied to a case where an NH$_3$ gas as a reaction gas is plasma-excited and supplied from the nozzle 249b to the wafer and then an H$_2$ gas is plasma-excited and supplied to the wafer. In this case, effects similar to those of the above-described embodiment may be obtained. Furthermore, the present disclosure may also be applied to a case where there is a plurality of buffer structures, such as the case where there are two buffer structures as in modification 1 or the case where there three buffer structures as in modification 2. In this case, effects similar to those of the above-described embodiment and modifications may be obtained.

The embodiments of the present disclosure have been concretely described above. However, the present disclosure is not limited to the above-described embodiments, and various modifications may be made without departing from the spirit thereof.

For example, in the above-described embodiments, there has been described the example where three electrodes are used as the plasma generation part. However, the present disclosure is not limited to this example. The present disclosure is also applicable to a case of using three or more odd number of electrodes such as five electrodes or seven electrodes. For example, in the case of forming a plasma generation part using five electrodes, it may be possible to adopt a configuration in which three electrodes in total including two electrodes arranged at the outermost positions and one electrode arranged at the center position are connected to a high-frequency power supply and two electrodes arranged in such a form as to be sandwiched by a high-frequency power supply is grounded.

Furthermore, in the above-described embodiments, there has been described the example where the number of electrodes on the high-frequency power supply side is larger than the number of electrodes on the ground side, and the electrode on the ground side is made common to the electrodes on the high-frequency power supply side. However, the present disclosure is not limited to this example. The number of electrodes on the ground side may be made larger than the number of electrodes on the high-frequency power supply side, and the electrode on the high-frequency power supply side may be made common to the electrodes on the ground side. However, when the number of electrodes on the ground side is made larger than the number of electrodes on the high-frequency power supply side, it is necessary to increase the electric power applied to the electrodes on the high-frequency power supply side. Thus, many particles may be generated. Therefore, it is preferable that the number of electrodes on the high-frequency power supply side is set to be larger than the number of electrodes on the ground side.

Furthermore, in the above-described embodiments, there has been described the example where the gas supply ports 302 and 304 formed in the buffer structure have the same opening area and are installed at the same opening pitch. However, the present disclosure is not limited to this example. The opening area of the gas supply ports 302 may be larger than the opening area of the gas supply ports 304. As the number of electrodes in the buffer chamber 237 increases, there is a high possibility that the plasma generated between the rod-shaped electrodes 269 and 270 located at the positions distant from the nozzle 249b becomes smaller than the plasma generated between the rod-shaped electrodes 270 and 271 located at the positions close to the nozzle 249b. Therefore, the opening area of the gas supply ports 302 formed at the positions distant from the nozzle 249b may be made larger than the opening area of the gas supply ports 304 formed at the positions close to the nozzle 249b.

Furthermore, in the above-described embodiments, there has been described the configuration in which, when installing a plurality of buffer structures, the same reaction gas is excited by plasma and supplied to the wafer. However, the present disclosure is not limited to this configuration. For each buffer structure, different reaction gases may be plasma-excited and supplied to the wafer. This makes it possible to control plasma for each buffer chamber and to supply different reaction gases for each buffer chamber. As compared with a case where plural types of reaction gases are supplied by one buffer structure, it is possible to reduce the number of unnecessary steps such as a purge step or the like and to improve the throughput.

In the above-described embodiments, there has been described the example where the reaction gas is supplied after supplying the precursor. The present disclosure is not limited to such an example. The supply order of the precursor and the reaction gas may be reversed. That is, the precursor may be supplied after supplying the reaction gas. By changing the supply order, it becomes possible to change the film quality and the composition ratio of the film to be formed.

In the above-described embodiments, there has been described the example where the SiN film is formed on the wafer 200. The present disclosure is not limited to such an example and may also be suitably applied to a case where an Si-based oxide film such as a silicon oxide film (SiO film), a silicon oxycarbide film (SiOC film), a silicon oxycarbonitride film (SiOCN film), a silicon oxynitride film (SiON film) or the like is formed on the wafer 200, or a case where a Si-based nitride film such as a silicon carbonitride film (SiCN film), a silicon boronitride film (SiBN film), a silicon boron carbonitride film (SiBCN film), a boron carbonitride film (BCN film) or the like is formed on the wafer 200. In these cases, as the reaction gas, in addition to the O-containing gas, it may be possible to use a C-containing gas such as C$_3$H$_6$ or the like, an N-containing gas such as NH$_3$ or the like, or a B-containing gas such as BCl$_3$ or the like.

The present disclosure may be suitably applied to a case where an oxide film or a nitride film containing a metal element such as titanium (Ti), zirconium (Zr), hafnium (Hf), tantalum (Ta), niobium (Nb), aluminum (Al), molybdenum (Mo), tungsten (W) or the like, i.e., a metal-based oxide film or a metal-based nitride film is formed on the wafer 200. That is, the present disclosure may be suitably applied to a case where a TiO film, a TiN film, a TiOC film, a TiOCN film, a TiON film, a TiBN film, a TiBCN film, a ZrO film, a ZrN film, a ZrOC film, a ZrOCN film, a ZrON film, a ZrBN film, a ZrBCN film, a HfO film, a HfN film, a HfOC film, a HfOCN film, a HfON film, a HfBN film, a HfBCN film, a TaO film, a TaOC film, a TaOCN film, a TaON film, a TaBN film, a TaBCN film, an NbO film, an NbN film, an NbOC film, an NbOCN film, an NbON film, an NbBN film, an NbBCN film, an AlO film, an AlN film, an AlOC film, an AlOCN film, an AlON film, an AlBN film, an AlBCN film, an MoO film, an MoN film, an MoOC film, an MoOCN film, an MoON film, an MoBN film, an MoBCN film, a WO film, a WN film, a WOC film, a WOCN film, a WON film, an MWBN film, a WBCN film or the like is formed on the wafer 200.

In these cases, as the precursor gas, it may be possible to use, for example, a tetrakis(dimethylamino) titanium (Ti[N(CH$_3$)$_2$]$_4$, abbreviation: TDMAT) gas, a tetrakis(ethylmethylamino) hafnium (Hf[N(C$_2$H$_5$) (CH$_3$)]$_4$, abbreviation: TEMAH) gas, a tetrakis(ethylmethylamino) zirconium (Zr[N(C$_2$H$_5$) (CH$_3$)]$_4$, abbreviation: TEMAZ) gas, a trimethylaluminum (Al(CH$_3$)$_3$, abbreviation: TMA) gas, a titanium tetrachloride (TiCl$_4$) gas, a hafnium tetrachloride (HfCl$_4$) gas or the like. As the reaction gas, it may be possible to use the aforementioned reaction gas.

That is, the present disclosure may be suitably applied to a case of forming a semimetal-based film containing a semimetal element or a metal-based film containing a metal element. The processing procedures and processing conditions of these film-forming processes may be the same processing procedures and processing conditions as those of the film-forming process shown in the above-described embodiments and modifications. Even in these cases, effects similar to those of the above-described embodiments and modifications may be obtained.

It is preferable that the recipes used for a film-forming process are individually prepared according to the processing contents and stored in the memory device 121c via the electric communication line or the external memory device 123. When starting various processes, it is preferable that the CPU 121a appropriately selects an appropriate recipe from the plurality of recipes stored in the memory device 121c according to the processing contents. This makes it possible to form thin films of various film types, composition ratios, film qualities and film thicknesses for general purposes and with high reproducibility in one substrate processing apparatus. It is also possible to reduce the burden on an operator and to quickly start various processes while avoiding operation errors.

The above-described recipes are not limited to the case of newly creating them, but may be prepared by, for example, changing the existing recipes already installed in the substrate processing apparatus. In the case of changing the recipes, the changed recipes may be installed in the substrate processing apparatus via an electric communication line or a recording medium in which the recipes are recorded. In addition, by operating the input/output device 122 installed in the existing substrate processing apparatus, the existing recipes already installed in the substrate processing apparatus may be directly changed.

As described above, according to the present disclosure, it is possible to provide a technique capable of uniformly processing a substrate.

The present disclosure provides some embodiments of a technique capable of uniformly processing a substrate.

What is claimed is:

1. A plasma generating device, comprising:
    a plurality of first rod-shaped electrodes connected to a high-frequency power supply;
    a second rod-shaped electrode that is installed between the plurality of first rod-shaped electrodes, and is grounded; and
    a buffer structure configured to form a buffer chamber that accommodates the plurality of first rod-shaped electrodes and the second rod-shaped electrode,
    wherein high-frequency power is applied from the high-frequency power supply to one of the plurality of first rod-shaped electrodes to convert gas into plasma in a plasma generation region between the one of the plurality of first rod-shaped electrodes and the second rod-shaped electrode,
    wherein high-frequency power is applied from the high-frequency power supply to another one of the plurality of first rod-shaped electrodes to convert gas into plasma in a plasma generation region between the another one of the plurality of first rod-shaped electrodes and the second rod-shaped electrode,
    wherein the buffer structure includes, on a side wall surface of the buffer structure facing one or more side surfaces of one or more substrates:
        at least one first gas supply port located between the one of the plurality of first rod-shaped electrodes and the second rod-shaped electrode; and
        at least one second gas supply port located between the another one of the plurality of first rod-shaped electrodes and the second rod-shaped electrode.

2. The plasma generating device of claim 1, wherein the at least one first gas supply port and the at least one second gas supply port are opened to face a center of the one or more substrates.

3. The plasma generating device of claim 1, wherein the buffer structure is installed along a stacking direction of the one or more substrates from a lower portion to an upper portion of a process chamber where the one or more substrates are processed.

4. The plasma generating device of claim 3, wherein the at least one first gas supply port includes a plurality of first gas supply ports, and the at least one second gas supply port includes a plurality of second gas supply ports,
    wherein the plurality of first gas supply ports is installed from the lower portion of the process chamber to the upper portion of the process chamber, and
    wherein the plurality of second gas supply ports is installed from the lower portion of the process chamber to the upper portion of the process chamber.

5. The plasma generating device of claim 1, wherein the buffer structure is installed in a process chamber.

6. A substrate processing apparatus, comprising:
    a process chamber in which one or more substrates are processed; and
    a plasma generator configured to activate gas by converting the gas into plasma
    wherein the plasma generator includes:
        a plurality of first rod-shaped electrodes connected to a high-frequency power supply;
        one or more second rod-shaped electrodes that are installed between the plurality of first rod-shaped electrodes, and are grounded; and
        one or more buffer structures configured to form one or more buffer chambers that accommodate the plurality of first rod-shaped electrodes and the one or more second rod-shaped electrodes,
    wherein the plasma generator is configured to:
        apply high-frequency power to one of the plurality of first rod-shaped electrodes from the high-frequency power supply to convert the gas into the plasma in a plasma generation region between the one of the plurality of first rod-shaped electrodes and one of the one or more second rod-shaped electrodes; and
        apply high-frequency power to another one of the plurality of first rod-shaped electrodes from the high-frequency power supply to convert the gas into the plasma in a plasma generation region between the another one of the plurality of first rod-shaped electrodes and the one of the one or more second rod-shaped electrodes, and wherein the one or more buffer structures include, on one or more side wall surfaces of the one or more buffer structures facing one or more side surfaces of the one or more substrates:
- at least one first gas supply port located between the one of the plurality of first rod-shaped electrodes and the one of the one or more second rod-shaped electrodes; and
- at least one second gas supply port located between the another one of the plurality of first rod-shaped electrodes and the one of the one or more second rod-shaped electrodes.

7. The substrate processing apparatus of claim 6, wherein the at least one first gas supply port and the at least one second gas supply port are opened to face a center of the one or more substrates.

8. The substrate processing apparatus of claim 6, wherein a number of the plurality of first rod-shaped electrodes is larger than a number of the one or more second rod-shaped electrodes.

9. The substrate processing apparatus of claim 6, further comprising:
a controller configured to control the high-frequency power supply,
wherein the controller controls the high-frequency power supply by monitoring an impedance of the plasma generator.

10. The substrate processing apparatus of claim 6, wherein the one or more buffer structures include a plurality of buffer structures, and different reaction gases are supplied to the plurality of buffer structures, respectively.

11. The substrate processing apparatus of claim 6, wherein the one or more buffer structures include a plurality of buffer structures, and the same reaction gas is supplied to the plurality of buffer structures.

12. The substrate processing apparatus of claim 6, wherein the one or more buffer structures include a plurality of buffer structures, and the plurality of buffer structures are installed, with an exhaust system interposed between the plurality of buffer structures, in a line-symmetrical manner with respect to a line passing through the exhaust system and a center of the process chamber.

13. The substrate processing apparatus of claim 6, wherein the one or more buffer structures are installed along a stacking direction of the one or more substrates from a lower portion to an upper portion of the process chamber.

14. The substrate processing apparatus of claim 13, wherein the at least one first gas supply port includes a plurality of first gas supply ports, and the at least one second gas supply port includes a plurality of second gas supply ports,
wherein the plurality of first gas supply ports is installed from the lower portion of the process chamber to the upper portion of the process chamber, and
wherein the plurality of second gas supply ports is installed from the lower portion of the process chamber to the upper portion of the process chamber.

15. The substrate processing apparatus of claim 6, wherein the one or more buffer structures are installed in the process chamber.

16. A method of manufacturing a semiconductor device, comprising:
accommodating a substrate in a process chamber;
converting gas into plasma by a plasma generator including:
- a plurality of first rod-shaped electrodes connected to a high-frequency power supply,
- a second rod-shaped electrode that is installed between the plurality of first rod-shaped electrodes, and is grounded, and
- a buffer structure configured to form a buffer chamber that accommodates the plurality of first rod-shaped electrodes and the second rod-shaped electrode, and including, on a side wall surface of the buffer structure facing a side surface of the substrate:
  - a first gas supply port located between one of the plurality of first rod-shaped electrodes and the second rod-shaped electrode; and
  - a second gas supply port located between another one of the plurality of first rod-shaped electrodes and the second rod-shaped electrode; and
supplying the gas, which is activated by converting the gas into plasma, to the substrate from the first gas supply port and the second gas supply port,
wherein high-frequency power is applied from the high-frequency power supply to the one of the plurality of first rod-shaped electrodes to convert the gas into the plasma in a plasma generation region between the one of the plurality of first rod-shaped electrodes and the second rod-shaped electrode, and
wherein high-frequency power is applied from the high-frequency power supply to the another one of the plurality of first rod-shaped electrodes to convert the gas into the plasma in a plasma generation region between the another one of the plurality of first rod-shaped electrodes and the second rod-shaped electrode.

17. The method of claim 16, wherein in the act of supplying the gas, the gas is supplied to the substrate in a direction parallel to a surface of the substrate from the first gas supply port and the second gas supply port opened so as to face a center of the substrate.

18. A non-transitory computer-readable recording medium storing a program that causes, by a computer, a substrate processing apparatus to perform a process comprising:
accommodating a substrate in a process chamber of the substrate processing apparatus;
converting a gas into plasma by a plasma generator including:
- a plurality of first rod-shaped electrodes connected to a high-frequency power supply,
- a second rod-shaped electrode that is installed between the plurality of first rod-shaped electrodes, and is grounded, and
- a buffer structure configured to form a buffer chamber that accommodates the plurality of first rod-shaped electrodes and the second rod-shaped electrode, and including, on a side wall surface of the buffer structure facing a side surface of the substrate:
  - a first gas supply port located between one of the plurality of first rod-shaped electrodes and the second rod-shaped electrode; and
  - a second gas supply port located between another one of the plurality of first rod-shaped electrodes and the second rod-shaped electrode; and supplying the gas, which is activated by converting the gas into plasma, to the substrate from the first gas supply port and the second gas supply port, wherein high-frequency power is applied from the high-frequency power supply to the one of the plurality of first rod-shaped electrodes to convert the gas into the plasma in a plasma generation region between the one of the plurality of first rod-shaped electrodes and the second rod-shaped electrode, and wherein high-frequency power is applied from the high-frequency power supply to the another one of the plurality of first rod-shaped electrodes to convert the gas into the plasma in a plasma generation region between another one of the plurality of first rod-shaped electrodes and the second rod-shaped electrode.

19. The non-transitory computer-readable recording medium of claim 18, wherein in the act of supplying the gas, the gas is supplied to the substrate in a direction parallel to a surface of the substrate from the first gas supply port and the second gas supply port opened so as to face a center of the substrate.

* * * * *